United States Patent
Yao et al.

(10) Patent No.: US 11,282,714 B2
(45) Date of Patent: Mar. 22, 2022

(54) ETCHING METHOD AND ETCHING DEVICE

(71) Applicants: CENTRAL GLASS COMPANY, LIMITED, Yamaguchi (JP); TOKYO ELECTRON LIMITED, Tokyo (JP)

(72) Inventors: Akifumi Yao, Yamaguchi (JP); Kunihiro Yamauchi, Yamaguchi (JP); Tatsuo Miyazaki, Tokyo (JP); Jun Lin, Yamanashi (JP); Susumu Yamauchi, Yamanashi (JP); Kazuaki Nishimura, Yamanashi (JP)

(73) Assignees: CENTRAL GLASS COMPANY, LIMITED, Yamaguchi (JP); TOKYO ELECTRON LIMITED, Tokyo (JP)

( * ) Notice: Subject to any disclaimer, the term of this patent is extended or adjusted under 35 U.S.C. 154(b) by 531 days.

(21) Appl. No.: 16/316,128

(22) PCT Filed: May 31, 2017

(86) PCT No.: PCT/JP2017/020237
§ 371 (c)(1),
(2) Date: Jan. 8, 2019

(87) PCT Pub. No.: WO2018/020822
PCT Pub. Date: Feb. 1, 2018

(65) Prior Publication Data
US 2021/0287915 A1    Sep. 16, 2021

(30) Foreign Application Priority Data

Jul. 26, 2016 (JP) .............................. JP2016-146303

(51) Int. Cl.
*H01L 21/321* (2006.01)
*H01L 21/3213* (2006.01)
*H01L 21/67* (2006.01)

(52) U.S. Cl.
CPC .. *H01L 21/32135* (2013.01); *H01L 21/67069* (2013.01)

(58) Field of Classification Search
None
See application file for complete search history.

(56) References Cited

U.S. PATENT DOCUMENTS 5,993,679 A      11/1999  Koide et al.
6,764,552 B1 *   7/2004   Joyce .................... B08B 7/0021
                                                    134/2

FOREIGN PATENT DOCUMENTS

JP    11-140652     5/1999
JP    2006-135058   5/2006
(Continued)

OTHER PUBLICATIONS

International Search Report dated Aug. 22, 2017 in International (PCT) Application No. PCT/JP2017/020237.

*Primary Examiner* — Roberts P Culbert
(74) *Attorney, Agent, or Firm* — Wenderoth, Lind & Ponack, L.L.P.

(57) ABSTRACT

The etching method of the present invention includes the step of supplying a first mixed gas containing a β-diketone-containing etching gas and a nitrogen oxide gas to a target having, on a surface, both a first metal film containing cobalt, iron, or manganese and a second metal film containing copper, thereby selectively etching the first metal film over the second metal film, or the step of supplying a second mixed gas containing a β-diketone-containing etching gas and oxygen gas to the target, thereby selectively etching the second metal film over the first metal film.

15 Claims, 10 Drawing Sheets

(56) References Cited

FOREIGN PATENT DOCUMENTS

| | | |
|---|---|---|
| JP | 2013-194307 | 9/2013 |
| JP | 2014-236096 | 12/2014 |
| TW | 373262 | 11/1999 |

* cited by examiner

ETCHING METHOD AND ETCHING DEVICE

TECHNICAL FIELD

The present invention relates to an etching method and an etching apparatus.

BACKGROUND ART

The wires of semiconductor devices have been formed of copper. However, as the wires have become finer, use of cobalt instead of copper as a wire material has been considered. The reason for the use of cobalt is as follows. When copper is used as a wire material, the copper wires need to be surrounded by a barrier film to prevent the metal atoms constituting the copper wires from diffusing into surrounding insulating films. In contrast, when cobalt is used as a wire material, the cobalt wires themselves function also as a barrier film, eliminating the need for separately forming a barrier film.

In order to form fine wires, precise control of metal film etching has been demanded. Specifically, for example, studies have been, made on metal film etching in which the variation in etching amount in the wafer plane is reduced to 1 nm or less, roughness control of the etched metal film surface, and selective etching of a metal film. Such precise etching control is difficult by wet etching, which uses liquid etchants to etch metal films. Thus, dry etching, which uses gas to etch metal films, has been studied.

Although not a method for fine etching of a metal film on a substrate, it has been proposed to use a β-diketone to dry-clean a metal film adhered to the inside of a film-forming device used in the semiconductor device production process.

For example, Patent Literature 1 discloses a cleaning method including removing metal copper adhered to the inside of a film formation treatment device by a cleaning step, wherein the cleaning step includes an oxidizing step of oxidizing metal copper to produce copper oxide, a complexing step of complexing the copper oxide to produce a copper complex, and a subliming step of subliming the copper complex. The Examples of Patent Literature 1 disclose introducing hexafluoroacetyl acetone (Hfac, also referred to as 1,1,1,5,5,5-hexafluoro-2,4-pentanedione), which is a β-diketone, and oxygen at the same time into a vacuum chamber to produce an complexing atmosphere and an oxidizing atmosphere at the same time. The literature teaches that this method enables smooth cleaning of the adhered metal copper film.

Patent Literature 2 discloses a dry cleaning method including removing a metal film adhered to a film-forming device by reacting a cleaning gas containing a β-diketone and $NO_x$ (NO or $N_2O$) with the metal film at a temperature in the range of 200° C. to 400° C. Patent Literature 2 discloses nickel, manganese, iron, and cobalt as examples of the metal constituting the metal film. Patent Literature 2 teaches that as compared with the use of oxygen, the use of $NO_x$ widens the temperature range in which the metal film can be removed by etching.

CITATION LIST

Patent Literature

Patent Literature 1: JP H11-140652 A
Patent Literature 2: JP 2013-194307 A

SUMMARY OF INVENTION

Technical Problem

As disclosed in Patent Literatures 1 and 2, metal film etching using a β-diketone is widely known. However, both of these literatures disclose methods for etching one type of metal film, and do not disclose a method for selectively etching a specific metal film (e.g., cobalt film or copper film) on a target having multiple types of metal films. Thus, to date, there have been no findings about the method for selectively etching a specific metal film.

The present invention was made in view of the above issues and aims to provide an etching method which, on a target having both a first metal film containing cobalt, iron, or manganese and a second metal film containing copper, enables selective etching of one of the first metal film or the second metal film. The present invention also aims to provide an etching apparatus for performing the etching method.

Solution to Problem

The present inventors found out that the ratio of the etching rate of the first metal film containing cobalt, iron, or manganese to the etching rate of the second metal film containing copper can be controlled by changing the type of gas added to the etching gas containing a β-diketone. They thus completed the present invention.

The etching method of the present invention includes the step of supplying a first mixed gas containing a β-diketone-containing etching gas and a nitrogen oxide gas to a target having, on a surface, both a first metal film containing cobalt, iron, or manganese and a second metal film containing copper, thereby selectively etching the first metal film over the second metal film.

In the etching method of the present invention, the etching rate of the first metal film containing cobalt, iron, or manganese can be increased compared with the etching rate of the second metal film containing copper by supplying the first mixed gas containing a β-diketone (e.g., Hfac)-containing etching gas and a nitrogen oxide gas to the target.

The concentration of the nitrogen oxide gas supplied in the step of supplying the first mixed gas is not limited. Still, too low a nitrogen oxide gas concentration slows down the etching of the first metal film. Too high a nitrogen oxide gas concentration may cause the etching to stop. Thus, in the step of supplying the first mixed gas, the nitrogen oxide gas preferably accounts for 0.01 to 10% by volume of the total amount of the first mixed gas.

In the step of supplying the first mixed gas, for a sufficient etching rate of the first metal film, the target is preferably heated at 150° C. to 250° C.

The etching method of the present invention preferably further includes the step of supplying the etching gas to the target before the step of supplying the first mixed gas.

Performing the step of supplying the β-diketone-containing etching gas (hereinafter also referred to as a pre-etching step) before the step of supplying the first mixed gas (hereinafter also referred to as a main etching step) can stabilize the etching rate of the first metal film. This is presumably because the pre-etching step removes a natural oxide film on the surface of the first metal film, thus allowing stable progress of etching in the subsequent main etching step.

The etching method of the present invention preferably further includes the step of supplying a reducing gas to the target before the step of supplying the first mixed gas. The reducing gas is preferably hydrogen gas.

While the supply of the first mixed gas allows selective etching of the first metal film over the second metal film, the surface of the second metal film not to be etched is also slightly etched. This reduces the surface smoothness of the second metal film. When the step of supplying a reducing gas (e.g., hydrogen gas) is performed before the step of supplying the first mixed gas, the second metal film not to be etched can maintain the surface smoothness. This is presumably because the supplied reducing gas reduces a natural oxide film on the surface of the second metal film, thus making the surface of the second metal film less prone to etching in the subsequent main etching step.

In the etching method of the present invention, the nitrogen oxide gas is preferably nitrogen monoxide gas.

In the etching method of the present invention, in the step of supplying the first mixed gas, at least one inert gas selected from the group consisting of nitrogen gas, argon gas, and helium gas is preferably further supplied.

In the etching method of the present invention, preferably, the first mixed gas contains a β-diketone-containing etching gas, nitrogen monoxide gas, and at least one inert gas selected from the group consisting of nitrogen gas, argon gas, and helium gas, in the step of supplying the first mixed gas, the nitrogen monoxide gas accounts for 0.01 to 10% by volume of the total amount of the first mixed gas, and the target is heated at 150° C. to 250° C.

The etching method of the present invention includes the step of supplying a second mixed gas containing a β-diketone-containing etching gas and oxygen gas to a target having, on a surface, both a first metal film containing cobalt, iron, or manganese and a second metal film containing copper, thereby selectively etching the second metal film over the first metal film.

In the etching method of the present invention, the etching rate of the second metal film containing copper can be increased compared with the etching rate of the first metal film containing cobalt, iron, or manganese by supplying the second mixed gas containing a β-diketone (e.g., Hfac)-containing etching gas and oxygen gas to the target.

The concentration of the oxygen gas added in the step of supplying the second mixed gas is not limited. For a sufficient etching rate of the second metal film, in the step of supplying the second mixed gas, the oxygen gas preferably accounts for 10 to 80% by volume of the total amount of the second mixed gas.

In the step of supplying the second mixed gas, for a sufficient etching rate of the second metal film, the target is preferably heated at 150° C. to 250° C.

In the etching method of the present invention, in the step of supplying the second mixed gas, at least one inert gas selected from the group consisting of nitrogen gas, argon gas, and helium gas may be further supplied.

The etching apparatus of the present invention includes a mount formed in a treatment chamber and configured to support a target having, on a surface, both a first metal film containing cobalt, iron, or manganese and a second metal film containing copper; an etching gas supplying unit configured to supply a β-diketone-containing etching gas to the target; a nitrogen oxide gas supplying unit configured to supply a nitrogen oxide gas to the target; an oxygen gas supplying unit configured to supply oxygen gas to the target; and a control unit configured to output a control signal such that in cases where the first metal film is selectively etched over the second metal film, a first mixed gas containing the etching gas and the nitrogen oxide gas is supplied to the target and in cases where the second metal film is selectively etched over the first metal film, a second mixed gas containing the etching gas and the oxygen gas is supplied to the target.

In the etching apparatus of the present invention, the control unit is preferably configured to output a control signal such that the etching gas is supplied to the target before the first mixed gas is supplied to the target.

Preferably, the etching apparatus of the present invention further includes a reducing gas supply unit configured to supply a reducing gas to the target, and the control unit is configured to output a control signal such that the reducing gas is supplied to the target before the first mixed gas is supplied to the target.

Preferably, the etching apparatus of the present invention further includes an inert gas supply unit configured to supply an inert gas to the target, and the control unit is configured to output a control signal such that in cases where the first metal film is selectively etched over the second metal film, a first mixed gas containing the etching gas, the nitrogen oxide gas, and the inert gas is supplied to the target and in cases where the second metal film is selectively etched over the first metal film, a second mixed gas containing the etching gas and the oxygen gas is supplied to the target.

Advantageous Effects of Invention

The present invention enables, on a target having both a first metal film containing cobalt, iron, or manganese and a second metal film containing copper, selective etching of one of the first metal film or the second metal film.

DESCRIPTION OF EMBODIMENTS

In the following, embodiments of the present invention will be described in detail.

The present invention, however, should not be limited to the embodiments, and appropriate modifications can be made without changing the gist of the present invention. Any combination of two or more preferred constituent elements of the embodiments is encompassed by the present invention.

The embodiments of the present invention are illustrative and the constituent elements described in different embodiments can be partially replaced or combined. In the second and later embodiments, the details common to the first embodiment are not described and only the differences are described. In particular, the same effects of the same constituent elements are not repeatedly mentioned for each embodiment.

The following embodiments describe the cases where the first metal film is a cobalt film and the second metal film is a copper film; however, in the etching method and etching apparatus of the present invention, the first metal film may be any metal film containing cobalt, iron or manganese. The first metal film may be a cobalt film, an iron film, or a manganese film, or may be a film of an alloy containing one or more of these metals. The second metal film may be any metal film containing copper. The second metal film may be a film of an alloy containing copper. All these metal films are considered to be etched by the same mechanism as that described in the following embodiments.

The following embodiments describe the cases where the nitrogen oxide gas is nitrogen monoxide gas; however, in the etching method and etching apparatus of the present invention, a nitrogen oxide gas other than nitrogen monoxide (NO) gas may be used. For example, dinitrogen monoxide ($N_2O$) gas may be used. Two or more of the nitrogen oxide gases may be used in combination.

First Embodiment

Figure 1:
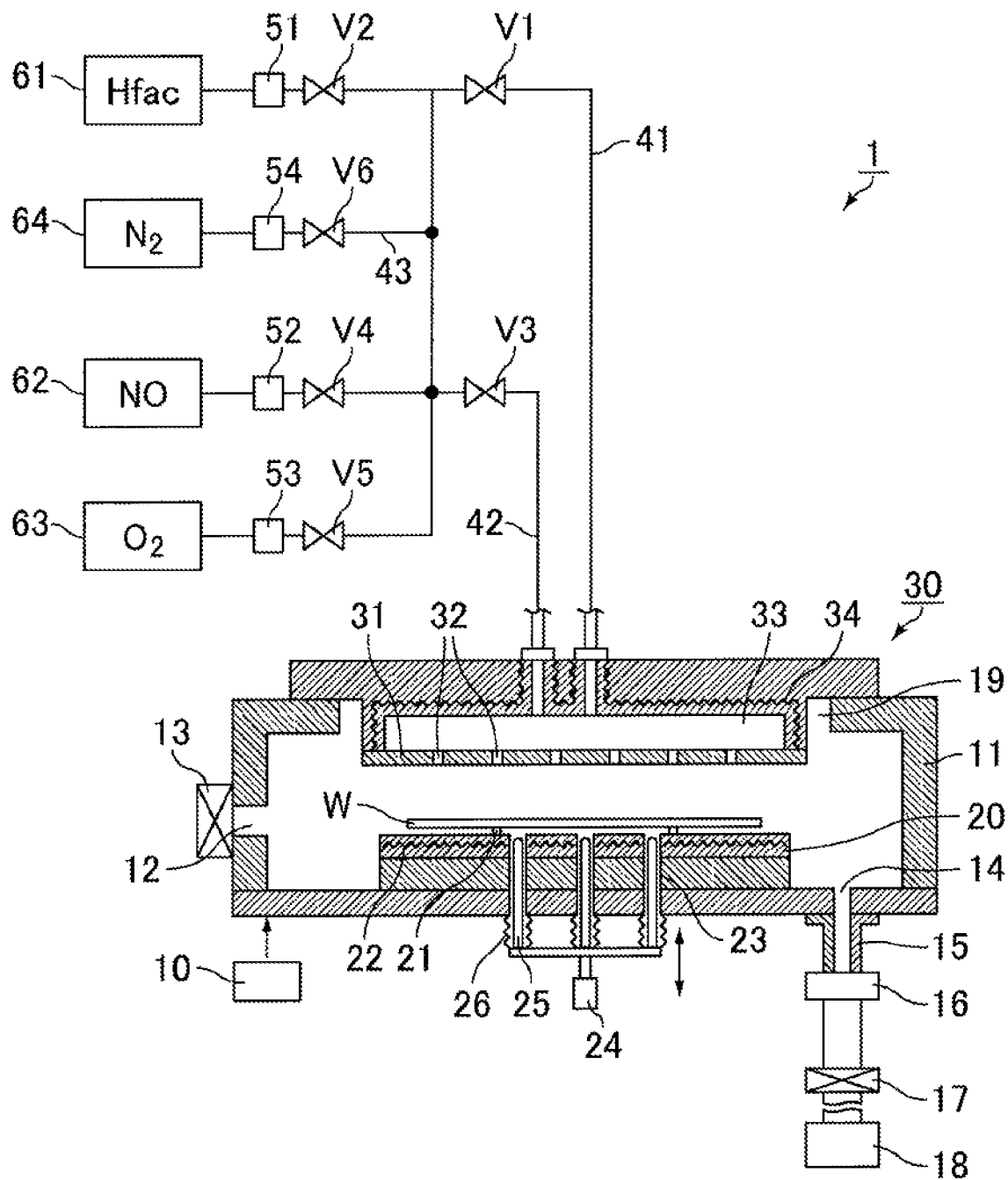
FIG. 1 is a schematic vertical cross-sectional view illustrating an etching apparatus according to a first embodiment of the present invention.

With reference to FIG. 1, an etching apparatus configured to perform an etching method according to a first embodiment of the present invention is described.

FIG. 1 is a schematic vertical cross-sectional view illustrating an etching apparatus according to the first embodiment of the present invention.

A wafer W is a target to be treated with an etching apparatus 1 shown in FIG. 1. The wafer W has, on a surface, both a cobalt film and a copper film to form wires of a semiconductor device. The etching apparatus 1 includes a treatment chamber 11 that is a vacuum chamber substantially circular in transverse cross-section. A carry-in/out port 12 opening at the side of the treatment chamber 11 for delivery of the wafer W is opened and closed by a gate valve 13. The treatment chamber 11 has a heater (not shown) that heats the inside of the chamber to a predetermined temperature.

The treatment chamber 11 has a cylindrical stage 20 inside as a mount for the wafer W. The wafer W mounted on the stage 20 is supported by multiple support pins 21. The support pins 21 are formed on the top surface of the stage 20 such that they hold the wafer W at, for example, 0.3 mm above the top surface of the stage 20. The stage 20 has a heater 22 inside that constitutes a heating unit. The heater 22 heats the wafer W mounted on the stage 20 to a set temperature.

Through-holes 23 pass through the stage 20 and the bottom of the treatment chamber 11 and are provided with ejector pins 25 for delivery of the wafer W. The ejector pins 25 are moved by a lifting mechanism 24 such that they project above and retract below the top surface of the stage 20. The lower end of each ejector pin 25 is covered with a bellows 26 to keep the treatment chamber 11 airtight. One end of an exhaust pipe 15 is connected to an exhaust port 14 opening at the bottom of the treatment chamber 11. The other end of the exhaust pipe 15 is connected to a vacuum pump 18 as an evacuation mechanism via a pressure adjusting valve 16 and an on/off valve 17 in this order.

A circular gas supplying unit 30 is formed to cover an opening 19 on the top of the treatment chamber 11. The gas supplying unit 30 has a circular diffuser 31 that faces the wafer W mounted on the stage 20. Gas supply holes 32 pass through the diffuser 31 in the thickness direction. The diffuser 31 is a punched plate having the gas supply holes 32 arranged in a matrix. Above the diffuser 31, a diffusion chamber 33 is formed to diffuse the gases to be supplied to the wafer W in the gas supplying unit 30. The gas supplying unit 30 has a heater 34 to heat the gas supplying unit 30.

Gas supply pipes 41 and 42 are open to the diffusion chamber 33 at their downstream ends. The upstream end of the gas supply pipe 41 is connected to a supply source 61 of hexafluoroacetyl acetone (Hfac) gas, which is a β-diketone gas, via a valve V1, valve V2, and a flow rate adjusting unit 51 in this order. The upstream end of the gas supplying pipe 42 is connected to a nitrogen monoxide (NO) gas supplying source 62 via a valve V3, a valve V4, and a flow rate adjusting unit 52 in this order. The upstream end of the gas supplying pipe 42 is also connected to an oxygen ($O_2$) gas supplying source 63 via the valve V3, a valve V5, and a flow rate adjusting unit 53 in this order.

The upstream end of a gas supplying pipe 43 is connected to a nitrogen ($N_2$) gas supplying source 64. The gas supplying pipe 43 is provided with, in order from upstream to downstream, a flow rate adjusting unit 54 and a valve V6. The downstream end of the gas supplying pipe 43 branches into two pipes, one of which is connected to the gas supply pipe 41 between the valves V1 and V2 and the other connected to the gas supplying pipe 42 between the valves V3 and V4 and the valves V3 and V5. The nitrogen monoxide gas is an oxidizing gas for oxidizing the cobalt film. The oxygen gas is an oxidizing gas for oxidizing the copper film. The Hfac gas is an etching gas for etching the oxidized cobalt film or copper film. The nitrogen gas is a diluent gas for diluting the Hfac gas, nitrogen monoxide gas, and oxygen gas.

The etching apparatus 1 further includes a control unit 10. The control unit 10 may include, for example, a computer, and may have a program, memory, and a CPU. The program includes a group of steps to execute a series of operations. The etching apparatus 1 performs operations such as adjustment of the temperature of the wafer W, opening and closing of the valves V, adjustment of the flow rates of gases, and adjustment of the pressure inside the treatment chamber 11 according to the program. This program is stored in a computer memory medium such as a compact disk, a hard disk, a magneto-optical disk, or a memory card, and installed in the control unit 10.

(Selective Etching of First Metal Film)

The following describes the method for selectively etching the cobalt film as the first metal film over the copper film as the second metal film. The operation of the etching apparatus 1 is described with reference to FIG. 2 and FIG.

3, and the flow of the etching treatment is described with reference to FIG. 4(a) to FIG. 4(d).

Figure 2:
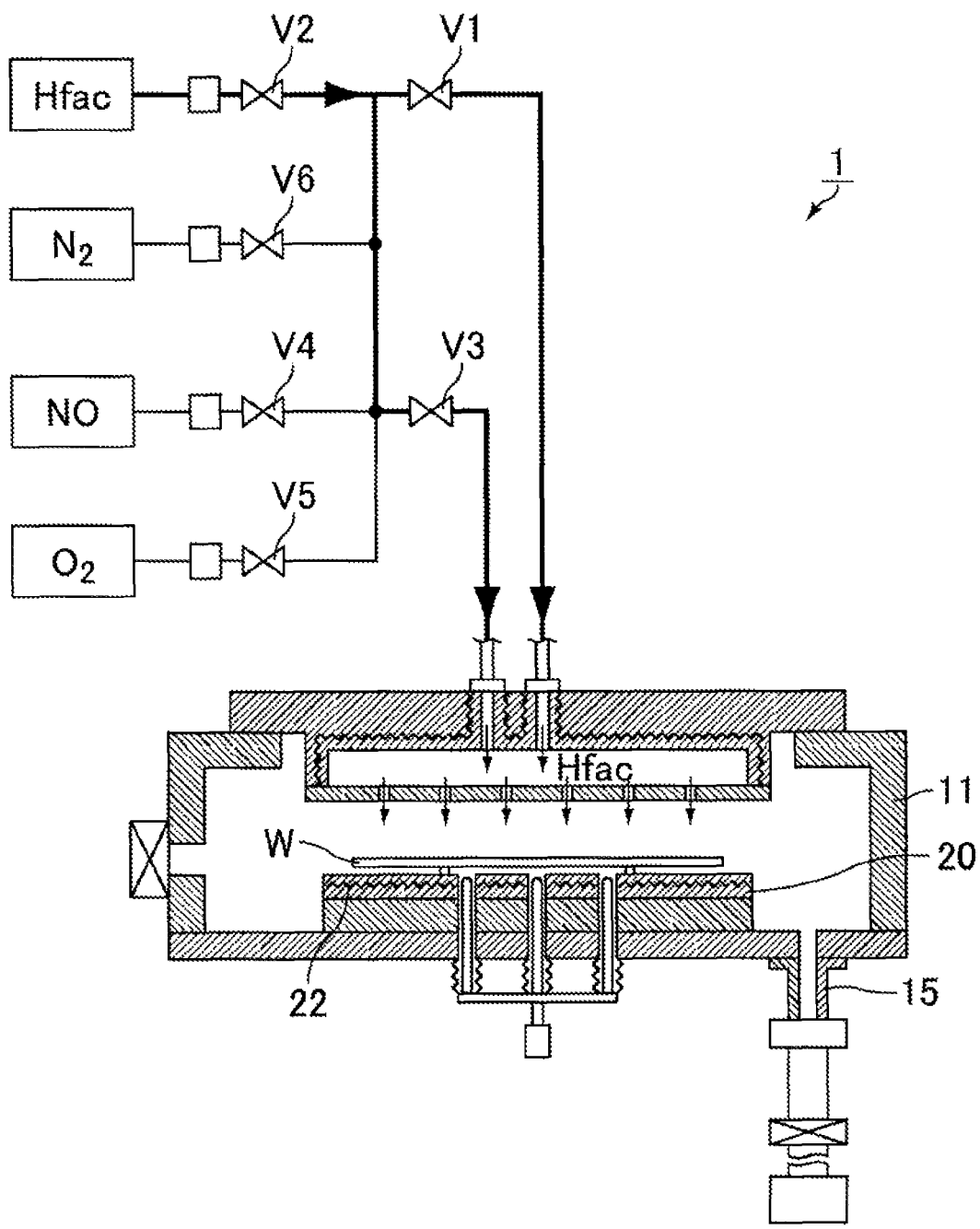
FIG. 2 is a schematic vertical cross-sectional view illustrating an etching gas supplying step.
Figure 3:
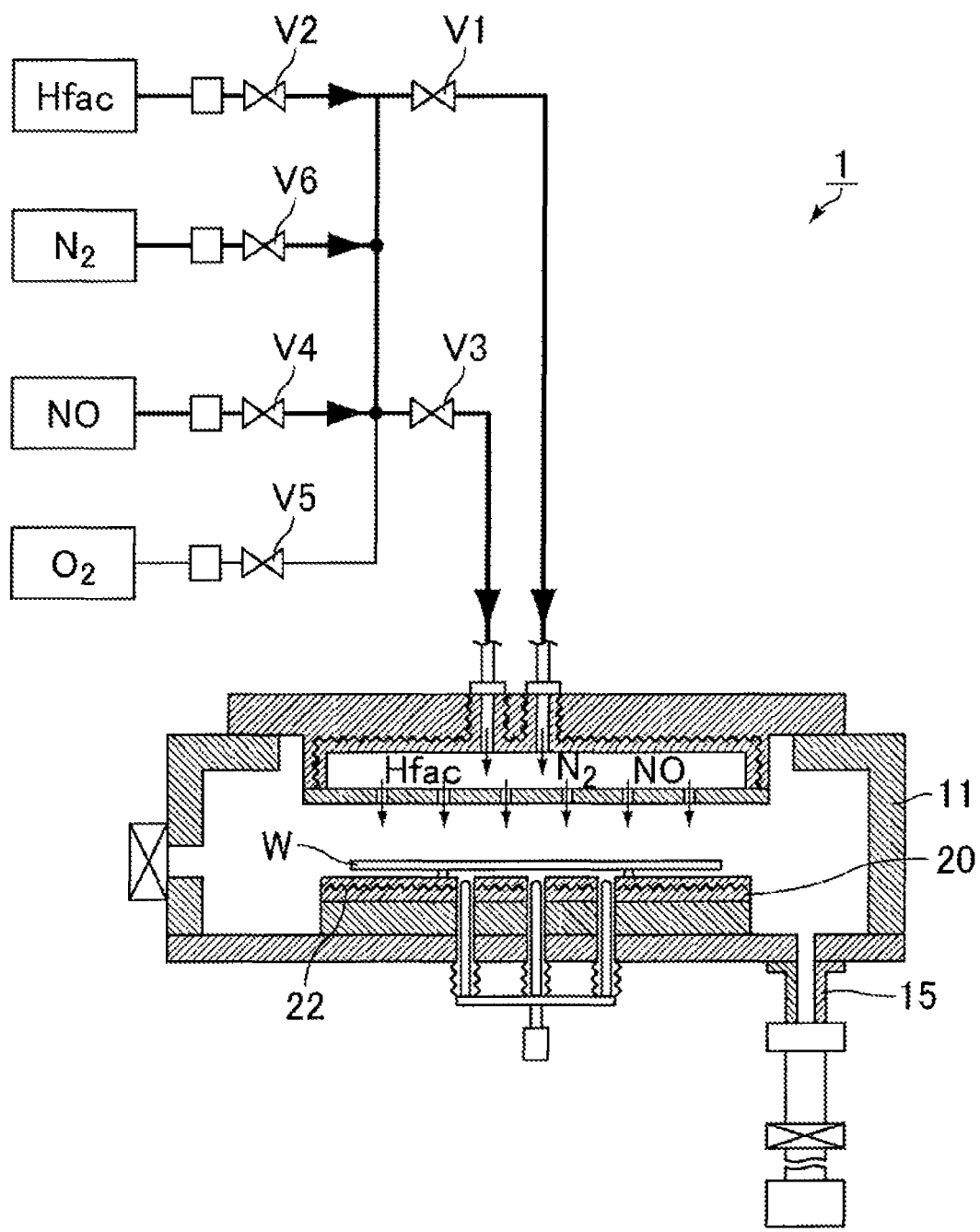
FIG. 3 is a schematic vertical cross-sectional view illustrating a first mixed gas supplying step.

FIG. 2 and FIG. 3 show the flow of gases in pipes. For each pipe, portions with gas flows are drawn in bolder lines than the portions with no gas flow.

First, the wafer W is mounted on the stage 20 in the treatment chamber 11. The treatment chamber 11 is evacuated until the pressure inside the chamber is reduced to a vacuum (about 1 Pa or lower).

At this time, the stage 20 is preferably heated by the heater 22 such that the wafer W is heated to a predetermined temperature.

Figure 4A:
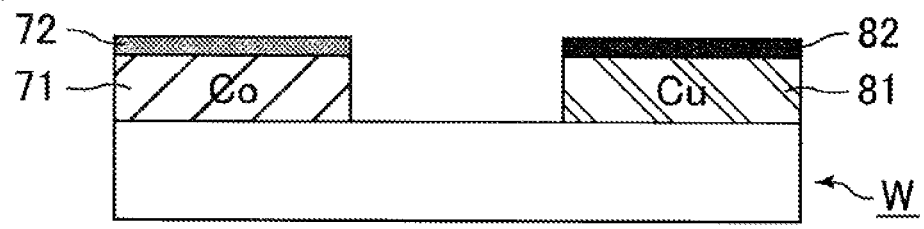
FIG. 4(a) is a schematic vertical cross-sectional view illustrating a wafer before etching treatment.

FIG. 4(a) is a schematic vertical cross-sectional view illustrating the wafer before etching treatment.

As shown in FIG. 4(a), the silicon wafer W has both a cobalt film 71 and a copper film 81 on a surface. The cobalt film 71 is considered to have a natural oxide film 72 on a surface, and the copper film 81 is considered to have a natural oxide film 82 on a surface.

The natural oxide films are considered to be formed also on side surfaces of the cobalt film and copper film, but omitted in FIG. 4(a).

Next, the etching gas supplying step (pre-etching step) is preferably performed. In the etching gas supplying step, Hfac gas as the etching gas is supplied to the wafer W.

The etching gas supplying step is an optional step. The first mixed gas supplying step may be performed immediately after the treatment chamber 11 with the wafer W mounted on the stage 20 is evacuated.

FIG. 2 is a schematic vertical cross-sectional view illustrating the etching gas supplying step.

As shown in FIG. 2, the valves V1, V2, and V3 are opened to supply Hfac gas to the treatment chamber 11.

Figure 4B:
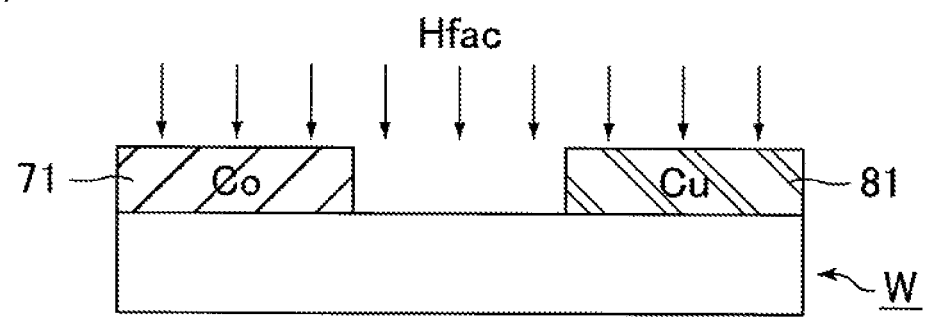
FIG. 4(b) is a schematic vertical cross-sectional view illustrating the wafer in the etching gas supplying step.

FIG. 4(b) is a schematic vertical cross-sectional view illustrating the wafer in the etching gas supplying step.

As shown in FIG. 4(b), Hfac is considered to remove the natural oxide film 72 on the surface of the cobalt film 71. Presumably, the natural oxide film 72 on the surface of the cobalt film 71 reacts with Hfac to form a complex of cobalt with Hfac, and sublimation of this complex removes the natural oxide film 72. The natural oxide film 82 on the surface of the copper film 81 reacts with Hfac and is removed, but the copper film 81 does not react and remains unremoved.

In the etching gas supplying step, the flow rate of the etching gas (e.g., Hfac gas) is dependent on the volume of the treatment chamber. For example, the Hfac gas flow rate in Examples below is 50 sccm (cc/min under standard conditions).

In the etching gas supplying step, the etching gas (e.g., Hfac) is preferably supplied alone, but may be diluted with a diluent gas such as nitrogen gas.

In the etching gas supplying step, a gas other than the etching gas and diluent gas may be supplied; however, it is preferred not to supply nitrogen monoxide gas, which can react with the natural oxide film on the surface of the first metal film, or oxygen gas, which contributes to the etching of the second metal film. Specifically, nitrogen monoxide gas and oxygen gas each preferably account for less than 0.01% by volume, more preferably less than 0.001% by volume, particularly preferably 0% by volume of the total amount of the gases supplied in the etching gas supplying step.

In the etching gas supplying step, the pressure inside the treatment chamber is preferably 20 to 100 Torr (2.67 to 13.3 kPa). Since Hfac has a vapor pressure at 20° C. of about 100 Torr, a pressure inside the treatment chamber of higher than 100 Torr may cause liquefaction of Hfac at a low-temperature portion of the treatment chamber. Too low a pressure inside the treatment chamber may cause uneven treatment of the surface of the cobalt film.

The treatment temperature in the etching gas supplying step may be any temperature at which the natural oxide film on the surface of the cobalt film can be removed. Since the complex of cobalt with Hfa has a melting point of around 170° C., the treatment temperature is preferably higher than or equal to this temperature. Still, even at a treatment temperature of, for example, 150° C., the natural oxide film can be removed by extending the treatment time. The treatment temperature in the etching gas supplying step may be different from the treatment temperature in the first mixed gas supplying step (described later), but is preferably the same as the treatment temperature in the first mixed gas supplying step from the viewpoint of the operation of the etching apparatus.

In the etching gas supplying step, the target is thus preferably heated at 150° C. to 250° C., more preferably 200° C. to 250° C., still more preferably 220° C. to 250° C.

The "treatment temperature in the etching gas supplying step", that is, "temperature at which the target is heated", means a set temperature of a heater for heating the wafer W as the target or means a surface temperature of the stage (susceptor) on which the wafer W as the target is mounted. The same shall apply to the treatment temperature in the first mixed gas supplying step, the treatment temperature in the second mixed gas supplying step, and the treatment temperature in the reducing gas supplying step (described later).

The treatment time in the etching gas supplying step may be appropriately adjusted according to factors such as the method for forming the cobalt film on the wafer surface.

After the etching gas supplying step, the valve V2 is closed to stop the Hfac gas supply to the treatment chamber 11 (not shown). The treatment chamber 11 is then evacuated until the pressure inside the treatment chamber 11 is reduced to a vacuum.

The first mixed gas supplying step may be performed immediately after the etching gas supplying step without stopping the Hfac gas supply or evacuating the treatment chamber.

Next, the first mixed gas supplying step (main etching step) is performed. In the first mixed gas supplying step, the first mixed gas containing Hfac gas and nitrogen monoxide gas is supplied to the wafer W.

FIG. 3 is a schematic vertical cross-sectional view illustrating the first mixed gas supplying step.

As shown in FIG. 3, the valves V2, V4, and V6 are opened to supply Hfac gas, nitrogen monoxide gas, and nitrogen gas to the treatment chamber 11.

Figure 4C:
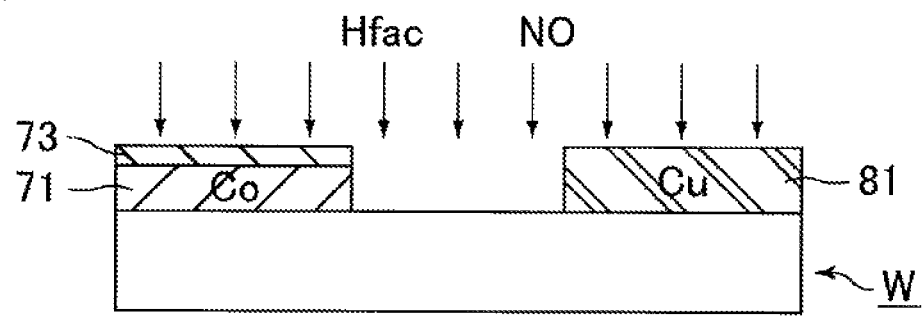
FIG. 4(c) and FIG. 4(d) are schematic vertical cross-sectional views illustrating the wafer in the first mixed gas supplying step.
Figure 4D:
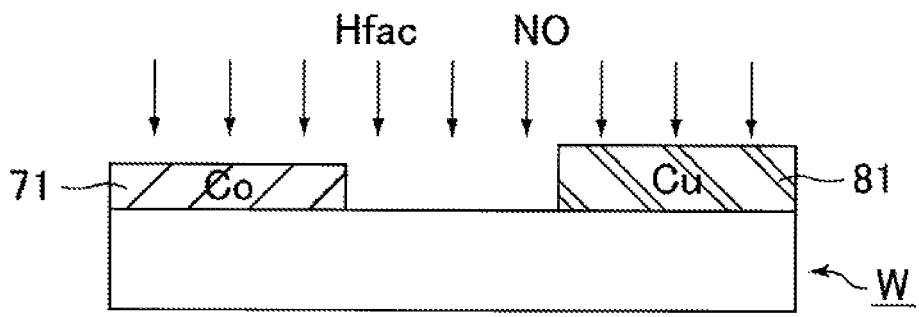

FIG. 4(c) and FIG. 4(d) are schematic vertical cross-sectional views illustrating the wafer in the first mixed gas supplying step.

As shown in FIG. 4(c), the surface of the cobalt film 71 reacts with nitrogen monoxide gas to cause complex formation, thus forming a complex layer 73. Then, as shown in FIG. 4(d), the complex layer 73 on the surface of the cobalt film 71 is removed, whereby the cobalt film 71 is etched. Presumably, the complex layer 73 on the surface of the cobalt film 71 reacts with Hfac gas to form a complex containing cobalt, NO, and Hfac, and sublimation of this complex removes the complex layer 73. Meanwhile, since copper is less likely to be oxidized than cobalt, the copper film 81 is hardly etched.

In the first mixed gas supplying step, the concentration of the etching gas (e.g., Hfac) is not limited. Still, a low etching gas concentration makes it difficult to achieve a sufficient etching rate. For a sufficient etching rate of the first metal film, thus, in the first mixed gas supplying step, the etching gas preferably accounts for 10 to 90% by volume, more preferably 30 to 60% by volume of the total amount of the first mixed gas.

In the first mixed gas supplying step, the nitrogen monoxide gas concentration is not limited. Still, too low a nitrogen monoxide gas concentration slows down the etching of the first metal film. Too high a nitrogen monoxide gas concentration may cause the etching to stop. Thus, in the first mixed gas supplying step, the nitrogen monoxide gas preferably accounts for 0.01 to 10% by volume, more preferably 0.05 to 8% by volume, still more preferably 0.1 to 5% by volume of the total amount of the first mixed gas.

In the first mixed gas supplying step, a diluent gas such as nitrogen gas may be supplied in addition to the etching gas and nitrogen monoxide gas.

In the first mixed gas supplying step, oxygen gas, which contributes to the etching of the second metal film, is preferably not supplied. Specifically, the oxygen gas preferably accounts for less than 0.01% by volume, more preferably less than 0.001% by volume, particularly preferably 0% by volume of the total amount of the first mixed gas.

The etching rate is proportional to pressure. Thus, in the first mixed gas supplying step, the higher the pressure inside the treatment chamber, the better. Here, since the Hfac may liquefy, the pressure needs to be adjusted according to the concentration and vapor pressure of the Hfac gas. In the first mixed gas supplying step, the pressure inside the treatment chamber is thus preferably 20 to 300 Torr (2.67 to 39.9 kPa), more preferably 50 to 250 Torr (6.67 to 33.3 kPa), still more preferably 100 to 200 Torr (13.3 to 26.7 kPa).

If the treatment temperature in the first mixed gas supplying step is low, the etching of the first metal film hardly proceeds, failing to achieve a sufficient etching rate. If the treatment temperature in the first mixed gas supplying step is high, not only the first metal film but also the second metal film tends to be etched. Thus, for a sufficient etching rate of the first metal film, in the first mixed gas supplying step, the target is preferably heated at 150° C. to 250° C., more preferably 200° C. to 250° C., still more preferably 220° C. to 250° C.

The treatment time in the first mixed gas supplying step may be appropriately adjusted according to the target etching amount.

After a desired amount of the surface of the cobalt film is etched, the valves V2 and V4 are closed to stop the supply of Hfac gas and nitrogen monoxide gas to the treatment chamber 11. The Hfac gas and nitrogen monoxide gas remaining in the treatment chamber 11 is purged with nitrogen gas supplied to the treatment chamber 11, whereby the etching treatment is completed (not shown).

In the first embodiment of the present invention, the etching rate of the first metal film containing cobalt, iron, or manganese can be increased compared with the etching rate of the second metal film containing copper by supplying the first mixed gas containing a β-diketone (e.g., Hfac)-containing etching gas and nitrogen monoxide gas to the target.

Specifically, the selectivity E1/E2 can be 10 or higher, where E1 is the etching rate of the first metal film and E2 is the etching rate of the second metal film. The selectivity E1/E2 is preferably 15 or higher, more preferably 30 or higher. The higher the upper limit of the selectivity E1/E2, the better.

(Selective Etching of Second Metal Film)

The following describes the method for selectively etching the copper film as the second metal film over the cobalt film as the first metal film. The operation of the etching apparatus 1 is described with reference to FIG. 5 and the flow of the etching treatment is described with reference to FIG. 6(a) to FIG. 6(c).

Figure 5:
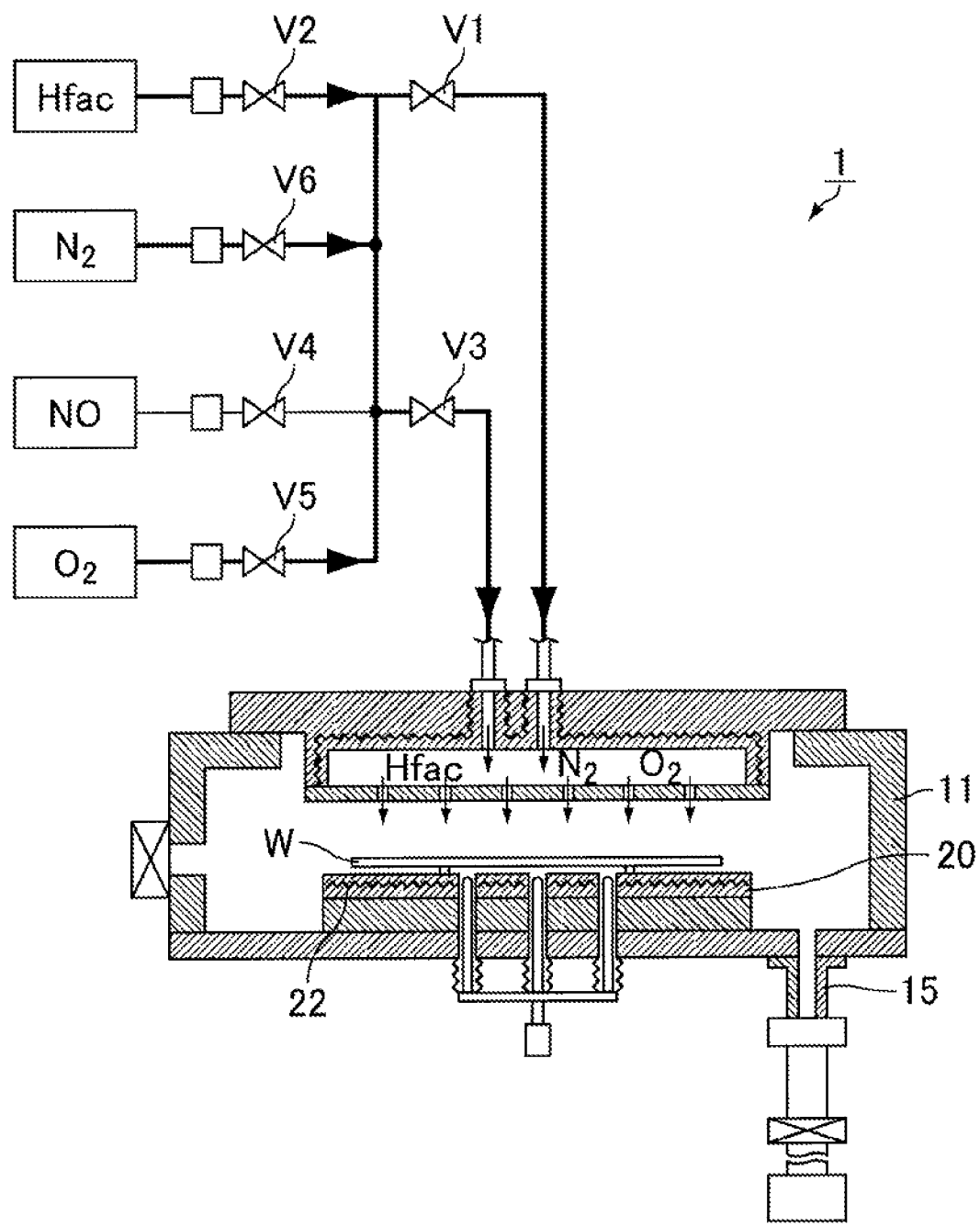
FIG. 5 is a schematic vertical cross-sectional view illustrating a second mixed gas supplying step.

FIG. 5 shows the flow of gases in pipes. For each pipe, portions with gas flows are drawn in bolder lines than the portions with no gas flow.

First, the wafer W is mounted on the stage 20 in the treatment chamber 11. The treatment chamber 11 is evacuated until the pressure inside the chamber is reduced to a vacuum (about 1 Pa or lower).

At this time, the stage 20 is preferably heated by the heater 22 such that the wafer W is heated to a predetermined temperature.

Figure 6:
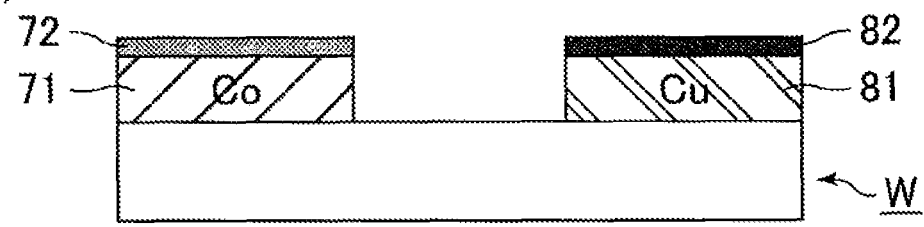
FIG. 6(a) is a schematic vertical cross-sectional view illustrating a wafer before etching treatment.
FIG. 6(b) and FIG. 6(c) are schematic vertical cross-sectional views illustrating the wafer in the second mixed gas supplying step.
Figure 6:
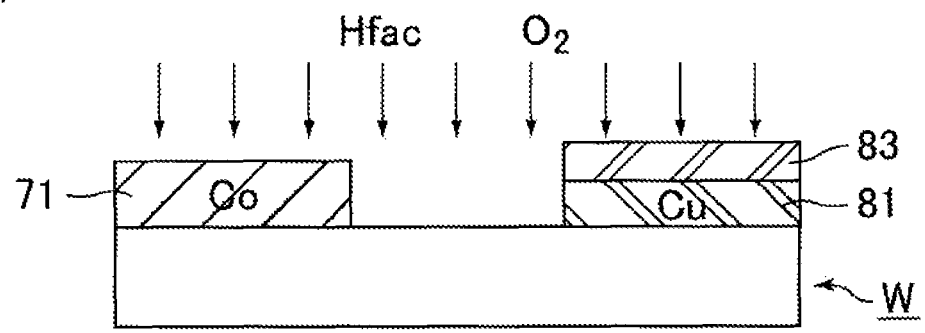
Figure 6:
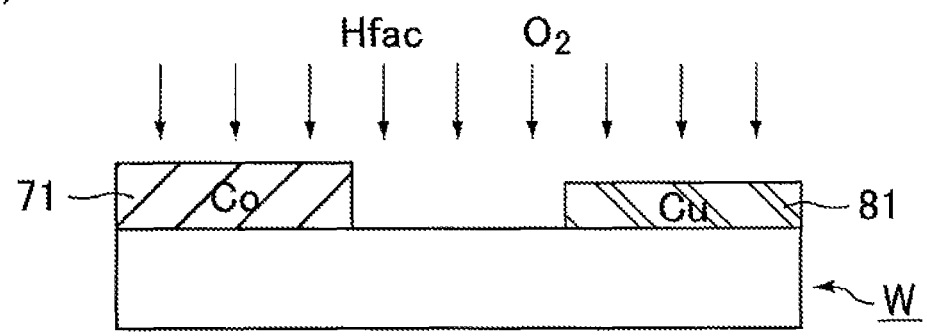

FIG. 6(a) is a schematic vertical cross-sectional view illustrating a wafer before etching treatment.

As shown in FIG. 6(a), the silicon wafer W has both the cobalt film 71 and the copper film 81 on a surface. The cobalt film 71 is considered to have the natural oxide film 72 on a surface, and the copper film 81 is considered to have the natural oxide film 82 on a surface.

The natural oxide films are considered to be formed also on side surfaces of the cobalt film and copper film, but are omitted in FIG. 6(a).

Next, the second mixed gas supplying step (main etching step) is performed. In the second mixed gas supplying step, a second mixed gas containing Hfac gas and oxygen gas is supplied to the wafer W.

FIG. 5 is a schematic vertical cross-sectional view illustrating the second mixed gas supplying step.

As shown in FIG. 5, the valves V2, V5, and V6 are opened to supply Hfac gas, oxygen gas, and nitrogen gas to the treatment chamber 11.

FIG. 6(b) and FIG. 6(c) are schematic vertical cross-sectional views illustrating the wafer in the second mixed gas supplying step.

As shown in FIG. 6(b), the surface of the copper film 81 (including the natural oxide film 82) reacts with oxygen gas to form an oxide film 83. Then, as shown in FIG. 6(c), the oxide film 83 on the surface of the copper film 81 is removed, whereby the copper film 81 is etched. Presumably, the oxide film 83 on the surface of the copper film 81 reacts with Hfac gas to form a complex containing copper and Hfac, and sublimation of this complex removes the oxide film 83. In the second mixed gas supplying step, the formation of the oxide film 83 shown in FIG. 6(b) and the removal of the oxide film 83 shown in FIG. 6(c) proceed simultaneously. Meanwhile, although the natural oxide film 72 of the cobalt film 71 is removed by Hfac, the cobalt film 71 is not etched in the second mixed gas supplying step. Since no nitrogen monoxide gas is supplied, no complex containing cobalt, NO, and Hfac is formed and thus the cobalt film 71 is hardly etched.

In the second mixed gas supplying step, the concentration of the etching gas (e.g., Hfac) is not limited. Still, a low etching gas concentration makes it difficult to achieve a sufficient etching rate. For a sufficient etching rate of the second metal film, thus, in the second mixed gas supplying step, the etching gas preferably accounts for 10 to 90% by volume, more preferably 30 to 60% by volume of the total amount of the second mixed gas.

In the second mixed gas supplying step, the oxygen gas concentration is not limited. Still, too low an oxygen gas concentration slows down the etching of the second metal film. Thus, in the second mixed gas supplying step, the oxygen gas preferably accounts for 10 to 80% by volume, more preferably 15 to 70% by volume, still more preferably 20 to 60% by volume of the total amount of the second mixed gas.

In the second mixed gas supplying step, a diluent gas such as nitrogen gas may be supplied in addition to the etching gas and oxygen gas.

In the second mixed gas supplying step, nitrogen monoxide gas, which contributes to the etching of the first metal film, is preferably not supplied. Specifically, the nitrogen monoxide gas preferably accounts for less than 0.01% by volume, more preferably less than 0.001% by volume, particularly preferably 0% by volume of the total amount of the second mixed gas.

The etching rate is proportional to pressure. Thus, in the second mixed gas supplying step, the higher the pressure inside the treatment chamber, the better. Here, since the Hfac may liquefy, the pressure needs to be adjusted according to the concentration and vapor pressure of the Hfac gas. In the second mixed gas supplying step, the pressure inside the treatment chamber is thus preferably 20 to 300 Torr (2.67 to 39.9 kPa), more preferably 50 to 250 Torr (6.67 to 33.3 kPa), still more preferably 100 to 200 Torr (13.3 to 26.7 kPa).

If the treatment temperature in the second mixed gas supplying step is low, the etching of the second metal film hardly proceeds, failing to achieve a sufficient etching rate. Thus, for a sufficient etching rate of the second metal film, in the second mixed gas supplying step, the target is preferably heated at 150° C. to 250° C., more preferably 200° C. to 250° C., still more preferably 220° C. to 250° C.

The treatment time in the second mixed gas supplying step may be appropriately adjusted according to the target etching amount.

After a desired amount of the surface of the copper film is etched, the valves V2 and V5 are closed to stop the supply of Hfac gas and oxygen gas to the treatment chamber 11. The Hfac gas and oxygen gas remaining in the treatment chamber 11 is purged with nitrogen gas supplied to the treatment chamber 11, whereby the etching treatment is completed (not shown).

In the first embodiment of the present invention, the etching rate of the second metal film containing copper can be increased compared with the etching rate of the first metal film containing cobalt, iron, or manganese by supplying the second mixed gas containing a β-diketone (e.g., Hfac)-containing etching gas and oxygen gas to the target.

Specifically, the selectivity E2/E1 can be 10 or higher, where E1 is the etching rate of the first metal film and E2 is the etching rate of the second metal film. The selectivity E2/E1 is preferably 30 or higher, more preferably 40 or higher. The higher the upper limit of the selectivity E2/E1, the better.

Second Embodiment

Figure 7:
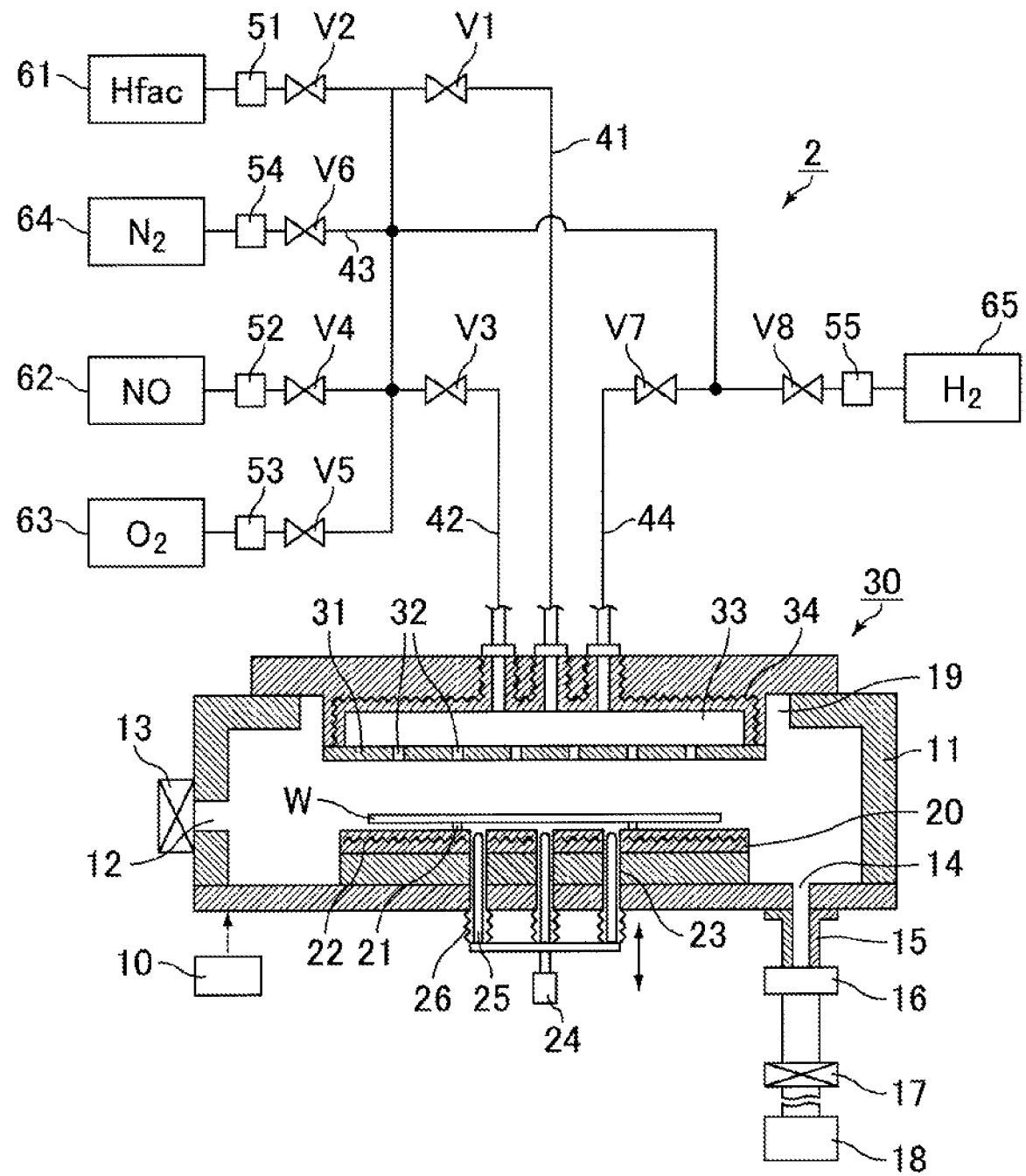
FIG. 7 is a schematic vertical cross-sectional view illustrating an etching apparatus according to a second embodiment of the present invention.

With reference to FIG. 7, an etching apparatus configured to perform an etching method according to a second embodiment of the present invention is described.

FIG. 7 is a schematic vertical cross-sectional view illustrating an etching apparatus according to the second embodiment of the present invention.

An etching apparatus 2 shown in FIG. 7 has a gas supplying pipe 44. The downstream end of the gas supplying pipe 44 is open to a diffusion chamber 33. The upstream end of the gas supplying pipe 44 is connected to a supplying source 65 of hydrogen ($H_2$) gas, which is a reducing gas, via a valve V7, a valve V8, and a flow rate adjusting unit 55 in this order.

The downstream end of the gas supplying pipe 43, whose upstream end is connected to the nitrogen gas supplying source 64, is branched into three pipes. Two of them are connected to the gas supply pipes 41 and 42 as in the etching apparatus 1 shown in FIG. 1, and the other one is connected to the gas supplying pipe 44 between the valves V7 and V8.

Except for the above features, the etching apparatus 2 shown in FIG. 7 has the same configuration as the etching apparatus 1 shown in FIG. 1.

(Selective Etching of First Metal Film)

The following describes the method for selectively etching the cobalt film as the first metal film over the copper film as the second metal film. The operation of the etching apparatus 2 is described with reference to FIG. 8 and FIG. 9 and the flow of the etching treatment is described with reference to FIG. 10(a) to FIG. 10(d).

Figure 8:
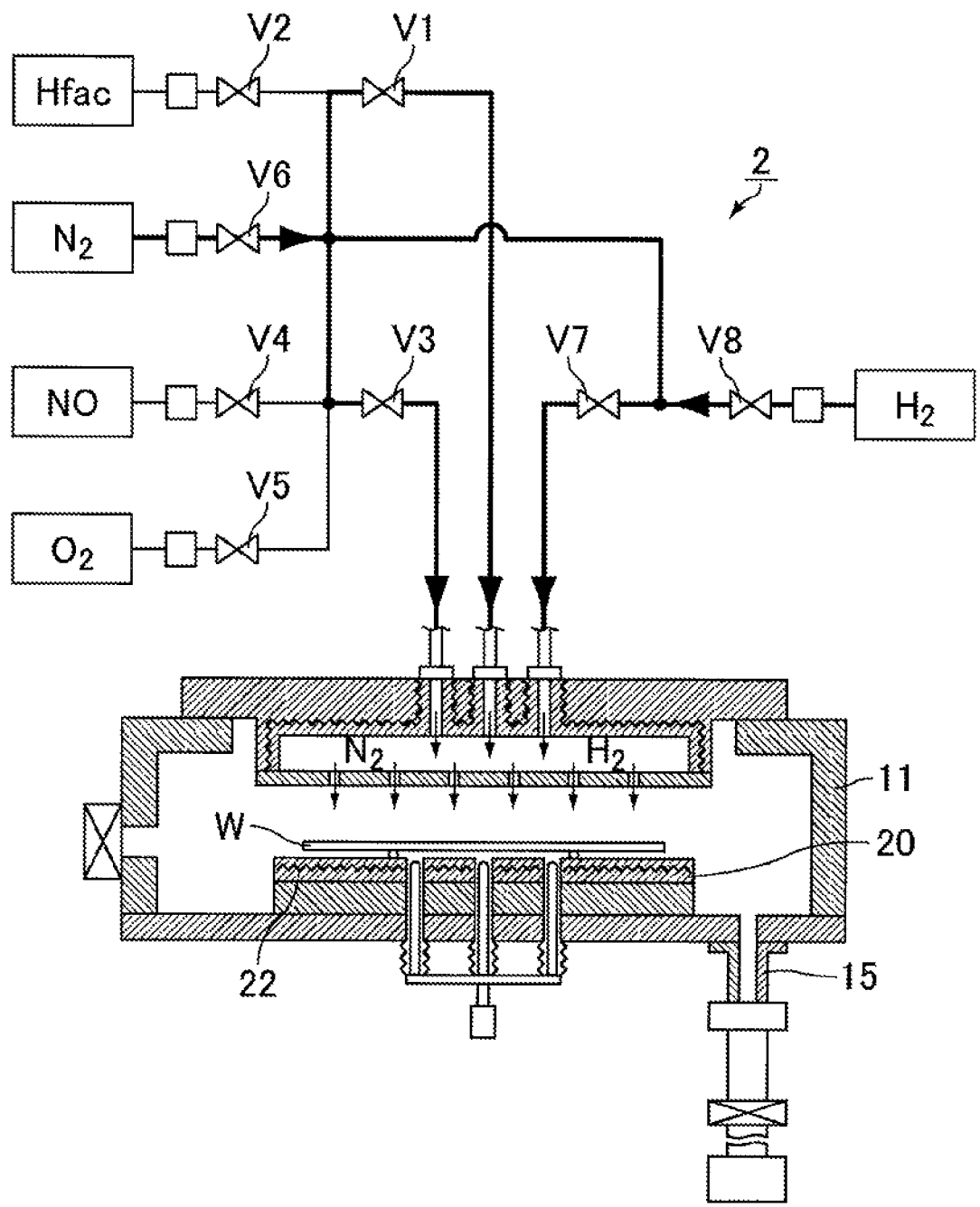
FIG. 8 is a schematic vertical cross-sectional view illustrating a reducing gas supplying step.
Figure 9:
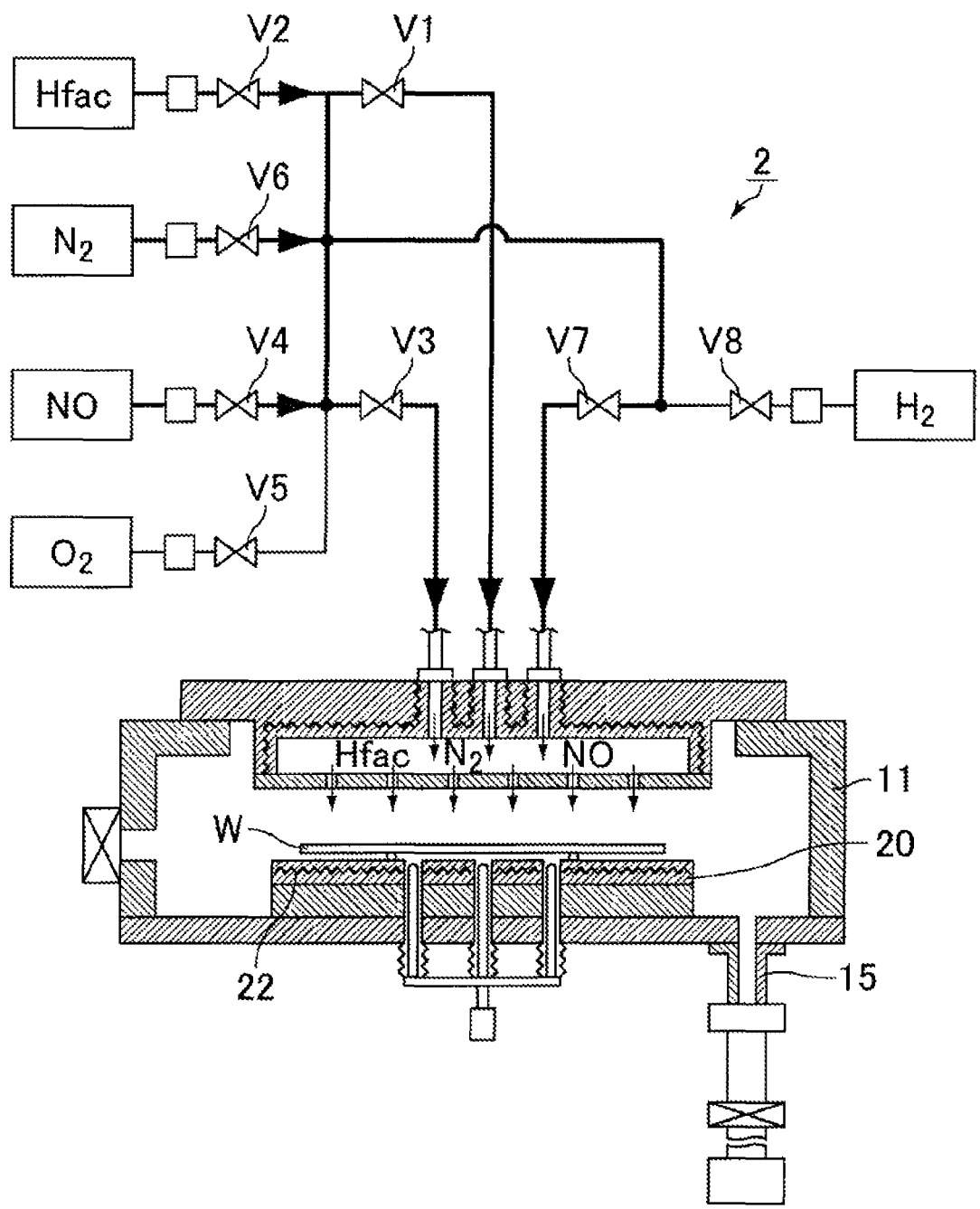
FIG. 9 is a schematic vertical cross-sectional view illustrating a first mixed gas supplying step.

FIG. 8 and FIG. 9 show the flow of gases in pipes. For each pipe, portions with gas flows are drawn in bolder lines than the portions with no gas flow.

First, the wafer W is mounted on the stage 20 in the treatment chamber 11. The treatment chamber 11 is evacuated until the pressure inside the chamber is reduced to a vacuum (about 1 Pa or lower).

At this time, the stage 20 is preferably heated by the heater 22 such that the wafer W is heated to a predetermined temperature.

Figure 10A:
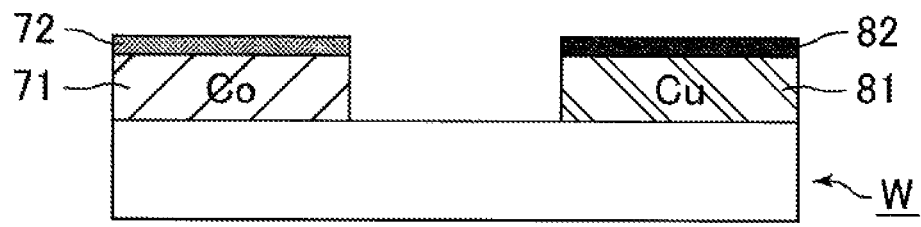
FIG. 10(a) is a schematic vertical cross-sectional view illustrating a wafer before etching treatment.

FIG. 10(a) is a schematic vertical cross-sectional view illustrating a wafer before etching treatment.

As shown in FIG. 10(a), the silicon wafer W has both the cobalt film 71 and the copper film 81 on a surface. The cobalt film 71 is considered to have the natural oxide film 72 on a surface, and the copper film 81 is considered to have the natural oxide film 82 on a surface.

The natural oxide films are considered to be formed also on side surfaces of the cobalt film and copper film, but omitted in FIG. 10(a).

Next, the reducing gas supplying step is performed. In the reducing gas supplying step, hydrogen gas as the reducing gas is supplied to the wafer W.

FIG. 8 is a schematic vertical cross-sectional view illustrating the reducing gas supplying step.

As shown in FIG. 8, the valves V1, V3, V6, V7, and V8 are opened to supply nitrogen gas and hydrogen gas to the treatment chamber 11.

Figure 10B:
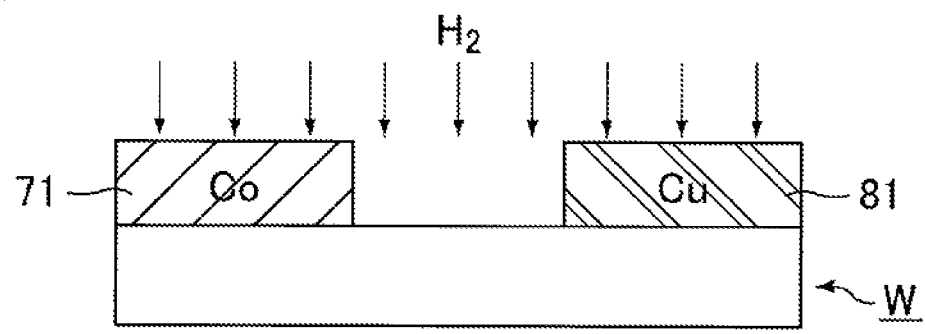
FIG. 10(b) is a schematic vertical cross-sectional view illustrating the wafer in the reducing gas supplying step.

FIG. 10(b) is a schematic vertical cross-sectional view illustrating the wafer in the reducing gas supplying step.

As shown in FIG. 10(b), the natural oxide film 72 on the surface of the cobalt film 71 and the natural oxide film 82 of the copper film 81 are both considered to be reduced by hydrogen.

In the reducing gas supplying step, the flow rate of the reducing gas (e.g., hydrogen gas) is dependent on the volume of the treatment chamber. For example, the hydrogen gas flow rate in Examples below is 5 to 20 sccm.

In the reducing gas supplying step, the reducing gas is not limited to hydrogen gas and may be, for example, a gas such as carbon monoxide (CO) or formaldehyde (HCHO).

In the reducing gas supplying step, the reducing gas (e.g., hydrogen gas) may be supplied alone, but is preferably diluted by a diluent gas such as nitrogen gas.

In the reducing gas supplying step, a gas other than the reducing gas and diluent gas may be supplied. Still, the etching gas (e.g., Hfac), nitrogen monoxide gas, and oxygen gas are preferably not supplied. Specifically, the etching gas, nitrogen monoxide gas, and oxygen gas preferably each account for less than 0.01% by volume, more preferably less than 0.001% by volume, particularly preferably 0% by volume of the total amount of the gases supplied in the reducing gas supplying step.

The treatment temperature in the reducing gas supplying step may be any temperature at which the natural oxide films can be reduced. Still, when the treatment temperature in the reducing gas supplying step is low, the reducing reaction hardly proceeds. The treatment temperature in the reducing gas supplying step may be high, but is preferably the same as the treatment temperature in the first mixed gas supplying step from the viewpoint of the operation of the etching apparatus.

In the reducing gas supplying step, the target is thus preferably heated at 200° C. to 350° C., more preferably 220° C. to 330° C., still more preferably 250° C. to 300° C.

In the reducing gas supplying step, the pressure inside the treatment chamber is not limited. For example, the pressure may be appropriately set in the range of 10 to 500 Torr (1.33 to 66.7 kPa) to according to the apparatus.

The treatment time in the reducing gas supplying step may be appropriately adjusted according to factors such as the method for forming the cobalt film and copper film on the wafer surface.

After the reducing gas supplying step, the valves V6 and V8 are closed to stop the supply of nitrogen gas and hydrogen gas to the treatment chamber 11 (not shown). The treatment chamber 11 is then evacuated until the pressure inside the chamber is reduced to a vacuum.

Next, the first mixed gas supplying step (main etching step) is performed. In the first mixed gas supplying step, the first mixed gas containing Hfac gas and nitrogen monoxide gas is supplied to the wafer W.

FIG. 9 is a schematic vertical cross-sectional view illustrating the first mixed gas supplying step.

As shown in FIG. 9, the valve V2, V4, and V6 are opened to supply Hfac gas, nitrogen monoxide gas, and nitrogen gas to the treatment chamber 11.

Figure 10C:
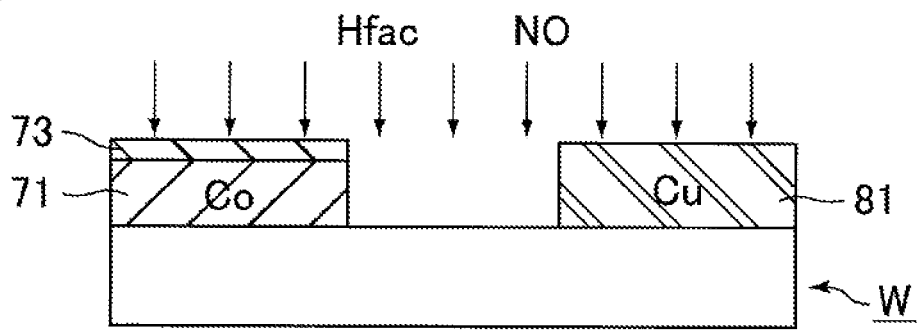
FIG. 10(c) and FIG. 10(d) are schematic vertical cross-sectional views illustrating the wafer in the first mixed gas supplying step.
Figure 10D:
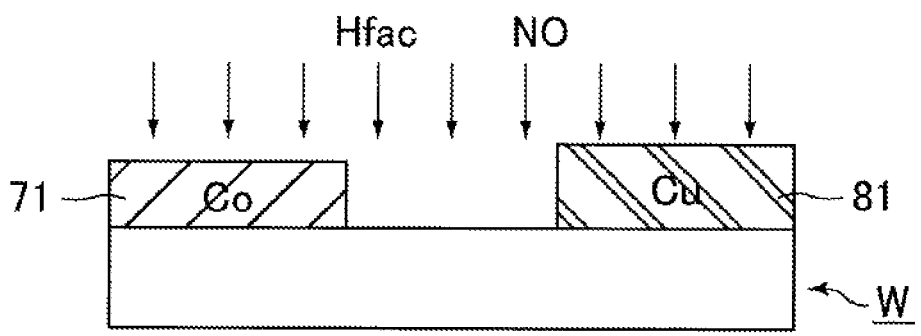

FIG. 10(c) and FIG. 10(d) are schematic vertical cross-sectional views illustrating the wafer in the first mixed gas supplying step.

As shown in FIG. 10(c), the surface of the cobalt film 71 reacts with nitrogen monoxide gas to cause complex formation, thus forming the complex layer 73. Then, as shown in FIG. 10(d), the complex layer 73 on the surface of the cobalt film 71 is removed, whereby the cobalt film 71 is etched. Presumably, the complex layer 73 on the surface of the cobalt film 71 reacts with Hfac gas to form a complex containing cobalt, NO, and Hfac, and sublimation of this complex removes the complex layer 73. Meanwhile, since copper is less likely to be oxidized than cobalt, the copper film 81 is hardly etched.

In the first mixed gas supplying step, the composition of the first mixed gas, the pressure in the treatment chamber, the treatment temperature, the treatment time are the same as those in the first embodiment. The detailed descriptions thereof are thus omitted.

After a desired amount of the surface of the cobalt film is etched, the valves V2 and V4 are closed to stop the supply of Hfac gas and nitrogen monoxide gas to the treatment chamber 11. The Hfac gas and nitrogen monoxide gas remaining in the treatment chamber 11 is purged with nitrogen gas supplied to the treatment chamber 11, whereby the etching treatment is completed (not shown).

In the second embodiment of the present invention, as in the first embodiment, the etching rate of the first metal film containing cobalt, iron, or manganese can be increased compared with the etching rate of the second metal film containing copper by supplying the first mixed gas containing a β-diketone (e.g., Hfac)-containing etching gas and nitrogen monoxide gas to the target.

In the second embodiment of the present invention, performing the step of supplying the reducing gas (e.g., hydrogen gas) before the step of supplying the first mixed gas makes it possible to maintain the surface smoothness of the second metal film not to be etched.

(Selective Etching of Second Metal Film)

The method for selectively etching the copper film as the second metal film over the cobalt film as the first metal film using the etching apparatus 2 shown in FIG. 7 is the same as that using the etching apparatus 1 shown in FIG. 1. The detailed description thereof is thus omitted. The step of supplying the etching gas (pre-etching step) may be performed before the step of supplying the second mixed gas containing the etching gas and oxygen gas (main etching step). The pre-etching step may be replaced with the step of supplying the reducing gas.

Other Embodiments

Although the above describes the etching methods using the etching apparatuses 1 and 2, the etching method of the present invention should not be limited to the above embodiments.

In the etching method and etching apparatus of the present invention, a gas containing a β-diketone other than Hfac may be used as the etching gas for etching the cobalt film and the copper film. For example, a β-diketone such as trifluoroacetyl acetone (also referred to as 1,1,1-trifluoro-2, 4-pentanedione) or acetyl acetone may be used. Two or more of these etching gases may be used in combination.

In the etching method and etching apparatus of the present invention, the diluent gas for diluting the etching gas, nitrogen monoxide gas, oxidizing gas, and reducing gas is not limited to nitrogen gas. For example, an inert gas such as argon (Ar) or helium (He) may be used. Two or more of these inert gases may be used in combination.

EXAMPLES

Examples specifically disclosing the present invention are shown below. The present invention should not be limited to these examples.

Example 1-1

A sample having a cobalt (Co) film on a surface of a silicon wafer was prepared. Separately, a sample having a copper (Cu) film on a surface of a silicon wafer was prepared. Each silicon wafer was 1-cm square and had a thickness of 0.1 mm.

To each sample was supplied Hfac gas as an etching gas (etching gas supplying step). The etching gas supplying step was performed under the conditions of a pressure of 20 to 100 Torr, a time of 15 min, a temperature of 150° C. to 250° C. The Hfac gas flow rate was 50 sccm.

After the etching gas supplying step, a first mixed gas containing Hfac gas, nitrogen monoxide (NO) gas, and nitrogen ($N_2$) gas was supplied (first mixed gas supplying step), whereby etching treatment was performed. Table 1 shows the gas composition, pressure, time, and temperature in the first mixed gas supplying step. The total flow rate of the gases supplied in the first mixed gas supplying step was 100 sccm.

Example 1-2 to Example 1-6

Etching treatment was performed by performing the etching gas supplying step and first mixed gas supplying step as in Example 1-1, except that the gas composition in the first mixed gases supplying step was changed as shown in Table 1.

Example 1-7

A sample having a cobalt (Co) film on a surface of a silicon wafer and a sample having a copper (Cu) film on a surface of a silicon wafer were prepared as in Example 1-1.

To each sample was supplied a second mixed gas containing Hfac gas, oxygen ($O_2$) gas, and nitrogen ($N_2$) gas (second mixed gas supplying step), whereby etching treatment was performed. Table 1 shows the gas composition, pressure, time, and temperature in the second mixed gas supplying step. The total flow rate of the gas supplied in the second mixed gas supplying step was 100 sccm.

Example 1-8 to Example 1-11

Etching treatment was performed by performing the second mixed gas supplying step as in Example 1-7, except that the gas composition in the second mixed gas supplying step was changed as shown in Table 1.

Comparative Example 1-1

A sample having a cobalt (Co) film on a surface of a silicon wafer and a sample having a copper (Cu) film on a surface of a silicon wafer were prepared as in Example 1-1.

To each sample was supplied a mixed gas containing Hfac gas and nitrogen ($N_2$) gas, whereby etching treatment was performed. Table 1 shows the gas composition, pressure, time, and temperature. The total flow rate of the supplied gases was 100 sccm.

For Example 1-1 to Example 1-11 and Comparative Example 1-1, the etching rate [nm/min] of each of the cobalt film and copper film was calculated. The etching rate was calculated by measuring the weight of the wafer before and after etching treatment, calculating the volume from the weight change and the density of the cobalt film or copper film, and dividing the resulting volume by the area of the wafer and the etching treatment time. In each example and comparative example, the etching treatment was performed on five samples having the cobalt film and five samples having the copper film, and the average of the etching rates was determined.

Table 1 shows the etching rate of the cobalt film, the etching rate of the copper film, the selectivity Co/Cu, and the selectivity Cu/Co. Table 1 shows representative results for each condition. Herein, the selectivity Co/Cu is determined by E1/E2 and the selectivity Cu/Co is determined by E2/E1, where E1 is the etching rate of the cobalt film and E2 is the etching rate of the copper film.

TABLE 1

| | Etching conditons | | | | | | Etching rate | | Selectivity | |
|---|---|---|---|---|---|---|---|---|---|---|
| | Hfac | Added gas | | | | | | | | |
| | [% by volume] | Type | [% by volume] | Pressure [Torr] | Time [min] | Temperature [° C.] | Co [nm/min] | Cu [nm/min] | Co/Cu | Cu/Co |
| Example 1-1 | 30-60 | NO | 0.1-5 | 100-200 | 5 | 220-250 | 24 | 0.7 | 34 | — |
| Example 1-2 | 30-60 | NO | 0.1-5 | 100-200 | 5 | 220-250 | 32 | 0.7 | 35 | — |
| Example 1-3 | 30-60 | NO | 0.1-5 | 100-200 | 5 | 220-250 | 25 | 0.8 | 31 | — |
| Example 1-4 | 30-60 | NO | 5-8 | 100-200 | 5 | 220-250 | 21 | 0.8 | 27 | — |
| Example 1-5 | 30-60 | NO | 8-10 | 100-200 | 5 | 220-250 | 12 | 0.8 | 15 | — |
| Example 1-6 | 30-60 | NO | 0.1-5 | 100-200 | 5 | 220-250 | 23 | 0.7 | 33 | — |
| Example 1-7 | 30-60 | $O_2$ | 10-20 | 100-200 | 5 | 220-250 | 0.5 | 15 | — | 30 |
| Example 1-8 | 30-60 | $O_2$ | 10-20 | 100-200 | 5 | 220-250 | 0.9 | 38 | — | 42 |
| Example 1-9 | 30-60 | $O_2$ | 20-60 | 100-200 | 5 | 220-250 | 0.7 | 46 | — | 66 |
| Example 1-10 | 30-60 | $O_2$ | 20-60 | 100-200 | 5 | 220-250 | 0.7 | 55 | — | 79 |
| Example 1-11 | 10-30 | $O_2$ | 60-80 | 100-200 | 5 | 220-250 | 0.4 | 16 | — | 40 |
| Comparative Example 1-1 | 30-60 | — | — | 100-200 | 5 | 220-250 | 0.2 | 0.1 | 2 | 0.5 |

Table 1 shows that in Example 1-1 to Example 1-6, in which the first mixed gas containing Hfac gas and nitrogen monoxide gas was supplied in etching treatment, the etching rate of the cobalt film was increased compared with the etching rate of the copper film and the selectivity Co/Cu was 15 or higher.

The results of Example 1-1 to Example 1-6 indicate that by adjusting the nitrogen monoxide gas concentration, the etching rate of the cobalt film can be adjusted with little change in the etching rate of the copper film.

Table 1 also shows that in Example 1-7 to Example 1-11, in which the second mixed gas containing Hfac gas and oxygen gas was supplied in etching treatment, the etching rate of the copper film was increased compared with the etching rate of the cobalt film and the selectivity Cu/Co was 30 or higher.

The results of Example 1-7 to Example 1-11 indicate that by adjusting the oxygen gas concentration, the etching rate of the copper film can be adjusted with little change in the etching rate of the cobalt film.

In Comparative Example 1-1, where no nitrogen monoxide gas or oxygen gas was added to Hfac gas in etching treatment, the cobalt film and copper film were hardly etched.

Example 2-1

A sample having a cobalt (Co) film on a surface of a silicon wafer and a sample having a copper (Cu) film on a surface of a silicon wafer were prepared as in Example 1-1.

To each sample were supplied hydrogen ($H_2$) gas as a reducing gas and nitrogen ($N_2$) gas (reducing gas supplying step). Table 2 shows the gas composition, pressure, time, and temperature in the reducing gas supplying step. The flow rate of the hydrogen gas was 5 to 20 sccm.

After the reducing gas supplying step, a first mixed gas containing Hfac gas, nitrogen monoxide (NO) gas, and nitrogen ($N_2$) gas was supplied (first mixed gas supplying step), whereby etching treatment was performed. Table 2 shows the gas composition, pressure, time, and temperature in the first mixed gas supplying step. The total flow rate of the gases supplied in the first mixed gases supplying step was 100 sccm.

Example 2-2

Etching treatment was performed by performing the reducing gas supplying step and the first mixed gas supplying step as in Example 2-1, except that the temperature in the reducing gas supplying step and the temperature in the first mixed gas supplying step were changed as shown in Table 2.

Example 2-3

Etching treatment was performed by performing the reducing gas supplying step and the first mixed gas supplying step as in Example 2-1, except that the gas composition in the first mixed gas supplying step was changed as shown in Table 2.

Example 2-4

Etching treatment was performed by performing the first mixed gas supplying step under the conditions shown in Table 2 without the reducing gas supplying step.

For Example 2-1 to Example 2-4, the etching rate [nm/min] of each of the cobalt film and copper film was calculated as in Example 1-1.

Table 2 shows the etching rate of the cobalt film, etching rate of the copper film, and selectivity Co/Cu. Table 2 shows representative results for each condition.

For Example 2-1 to Example 2-4, the surface roughness (root mean square (RMS) roughness) of the copper film was measured with an atomic force microscope (AFM). In each of the examples, the surface roughness of the copper film was measured at five sites and the average thereof was determined. Table 2 shows the surface roughness of the copper films of Example 2-1 to Example 2-4.

The unetched copper film, that is, the copper film before the reducing gas supplying step and first mixed gas supplying step, had a surface roughness of 3.0 nm.

TABLE 2

|  | Reducing gas supplying step | | | | First mixed gas supplying step | | | | | Etching rate | | | Cu film |
|---|---|---|---|---|---|---|---|---|---|---|---|---|---|
|  | $H_2$ [% by volume] | Pressure [Torr] | Time [min] | Temperature [° C.] | Hfac [% by volume] | NO [% by volume] | Pressure [Torr] | Time [min] | Temperature [° C.] | Co [nm/min] | Cu [nm/min] | Selectivity Co/Cu | Surface roughness [nm] |
| Example 2-1 | 5-20 | 10-500 | 10 | 200-250 | 30-60 | 0.1-5 | 100-200 | 5 | 250-300 | 40 | 1 | 40 | 3.2 |
| Example 2-2 | 5-20 | 10-500 | 10 | 200-250 | 30-60 | 0.1-5 | 100-200 | 5 | 200-250 | 19 | 0.8 | 24 | 3.3 |
| Example 2-3 | 5-20 | 10-500 | 10 | 200-250 | 30-60 | 0.1-5 | 100-200 | 5 | 200-250 | 15 | 0.8 | 19 | 3.1 |
| Example 2-4 | Not performed | | | | 30-60 | 0.1-5 | 100-200 | 5 | 250-300 | 34 | 1.1 | 31 | 12.0 |

Table 2 shows that in Example 2-1 to Example 2-3, in which the reducing gas supplying step was performed before the first mixed gas supplying step, the etching rate of the cobalt film was increased compared with the etching rate of the copper film as in Example 1-1 to Example 1-6, and the selectivity Co/Cu was 19 or higher.

Moreover, in Example 2-1 to Example 2-3, in which the reducing gas supplying step was performed before the first mixed gas supplying step, the copper films had a surface roughness of 3.1 to 3.3 nm. This shows that the copper films maintained the surface smoothness even after the etching treatment.

In Example 2-4, in which the reducing gas supplying step was not performed, although the etching rate of the cobalt film was increased compared with the etching rate of the copper film, the copper film had a surface roughness of 12.0 nm. This shows that the copper film had a reduced surface smoothness after the etching treatment.

REFERENCE SIGNS LIST

W wafer (target)
1, 2 etching apparatus
10 control unit
11 treatment chamber
20 stage (mount)
30 gas supplying unit
61 Hfac gas supplying source
62 nitrogen monoxide gas supplying source
63 oxygen gas supplying source
64 nitrogen gas supplying source
65 hydrogen gas supplying source
71 cobalt film (first metal film)
81 copper film (second metal film)

The invention claimed is:
1. An etching method comprising the step of:
supplying a first mixed gas containing a β-diketone-containing etching gas and a nitrogen oxide gas to a target having, on a surface, both a first metal film containing cobalt, iron, or manganese and a second metal film containing copper, thereby selectively etching the first metal film over the second metal film.

2. The etching method according to claim 1,
wherein in the step of supplying the first mixed gas, the nitrogen oxide gas accounts for 0.01 to 10% by volume of the total amount of the first mixed gas.

3. The etching method according to claim 1,
wherein in the step of supplying the first mixed gas, the target is heated at 150° C. to 250° C.

4. The etching method according to claim 1, further comprising the step of supplying the etching gas to the target before the step of supplying the first mixed gas.

5. The etching method according to claim 1, further comprising the step of supplying a reducing gas to the target before the step of supplying the first mixed gas.

6. The etching method according to claim 5,
wherein the reducing gas is hydrogen gas.

7. The etching method according to claim 1,
wherein the nitrogen oxide gas is nitrogen monoxide gas.

8. The etching method according to claim 1,
wherein in the step of supplying the first mixed gas, at least one inert gas selected from the group consisting of nitrogen gas, argon gas, and helium gas is further supplied.

9. The etching method according to claim 1,
wherein the first mixed gas contains a β-diketone-containing etching gas, nitrogen monoxide gas, and at least one inert gas selected from the group consisting of nitrogen gas, argon gas, and helium gas;
in the step of supplying the first mixed gas, the nitrogen monoxide gas accounts for 0.01 to 10% by volume of the total amount of the first mixed gas; and
the target is heated at 150° C. to 250° C.

10. An etching apparatus comprising:
a mount formed in a treatment chamber and configured to support a target having, on a surface, both a first metal film containing cobalt, iron, or manganese and a second metal film containing copper;
an etching gas supplying unit configured to supply a β-diketone-containing etching gas to the target;
a nitrogen oxide gas supplying unit configured to supply a nitrogen oxide gas to the target;
an oxygen gas supplying unit configured to supply oxygen gas to the target; and
a control unit configured to output a control signal such that in cases where the first metal film is selectively etched over the second metal film, a first mixed gas containing the etching gas and the nitrogen oxide gas is supplied to the target and in cases where the second metal film is selectively etched over the first metal film, a second mixed gas containing the etching gas and the oxygen gas is supplied to the target.

11. The etching apparatus according to claim 10,
wherein the control unit is configured to output a control signal such that the etching gas is supplied to the target before the first mixed gas is supplied to the target.

12. The etching apparatus according to claim 10, further comprising a reducing gas supply unit configured to supply a reducing gas to the target,
wherein the control unit is configured to output a control signal such that the reducing gas is supplied to the target before the first mixed gas is supplied to the target.

13. The etching apparatus according to claim 10, further comprising an inert gas supply unit configured to supply an inert gas to the target,
wherein the control unit is configured to output a control signal such that in cases where the first metal film is selectively etched over the second metal film, a first mixed gas containing the etching gas, the nitrogen oxide gas, and the inert gas is supplied to the target and in cases where the second metal film is selectively etched over the first metal film, a second mixed gas containing the etching gas and the oxygen gas is supplied to the target.

14. The etching method according to claim 1,
wherein the β-diketone is hexafluoroacetyl acetone, trifluoroacetyl acetone, or acetyl acetone.

15. The etching method according to claim 1,
wherein the β-diketone is hexafluoroacetyl acetone.

* * * * *